US011769764B2

(12) United States Patent
Trester

(10) Patent No.: US 11,769,764 B2
(45) Date of Patent: Sep. 26, 2023

(54) METHOD FOR CHANGING AN INTEGRATED CIRCUIT DESIGN

(71) Applicant: NXP B.V., Eindhoven (NL)

(72) Inventor: Sven Trester, Goessendorf (AT)

(73) Assignee: NXP B.V., Eindhoven (NL)

( * ) Notice: Subject to any disclaimer, the term of this patent is extended or adjusted under 35 U.S.C. 154(b) by 206 days.

(21) Appl. No.: 16/918,289

(22) Filed: Jul. 1, 2020

(65) Prior Publication Data

US 2021/0020623 A1     Jan. 21, 2021

(30) Foreign Application Priority Data

Jul. 19, 2019  (EP) ..................... 19187358

(51) Int. Cl.
| | |
|---|---|
| *H01L 21/768* | (2006.01) |
| *H01L 23/522* | (2006.01) |
| *H01L 23/00* | (2006.01) |
| *H01L 23/31* | (2006.01) |
| *H01L 23/495* | (2006.01) |
| *H01L 23/528* | (2006.01) |
| *H01L 23/532* | (2006.01) |
| *H01L 27/02* | (2006.01) |
| *G06F 30/392* | (2020.01) |

(Continued)

(52) U.S. Cl.
CPC ........ *H01L 27/0207* (2013.01); *G06F 30/392* (2020.01); *H01L 21/823828* (2013.01); *H01L 27/092* (2013.01)

(58) Field of Classification Search
CPC .......... G03F 1/70; G06F 30/394; G06F 30/33; G06F 30/39; G06F 30/392; G06F 2117/06; G06F 2119/18; H01L 27/0207; H01L 21/823828; H01L 27/092; Y02P 90/02

See application file for complete search history.

(56) References Cited

U.S. PATENT DOCUMENTS

| | | |
|---|---|---|
| 7,683,403 B2 | 3/2010 | Tripathi |
| 7,921,395 B2 | 4/2011 | Okumura |
| 8,661,391 B1 | 2/2014 | Viswanath et al. |

(Continued)

OTHER PUBLICATIONS

Sarker, Bodhisatya et al.; "Methodology and Design Challenges for Low Power Implementation at Sub 90nm;" Proceedings 2007 IEEE SoutheastCon; Mar. 22-25, 2007, Richmond, Virginia; DOI: 10.1109/SECON.2007.343009.

*Primary Examiner* — Marcos D. Pizarro
*Assistant Examiner* — Tenley H Schofield

(57) ABSTRACT

Disclosed is a method for designing an integrated circuit, wherein the integrated circuit is to be structured in cells, wherein the cells are to comprise functional cells and spare cells. The method comprises: a) designing at least one functional cell; and b) placing a plurality of functional cells on associated pattern positions of an, in particular regular, pattern matrix designed for the functional cells. The method further comprises c) placing, on at least one of the remaining pattern positions of the pattern matrix and instead of at least one spare cell conceivable for the at least one of the remaining pattern positions of the pattern matrix, a gate-based decoupling cell, and alternatively or in addition, d) placing, in at least one gap between pattern positions of the matrix pattern and instead of at least one filler cell conceivable for the at least one gap between pattern positions of the pattern matrix, a gate-based decoupling cell.

8 Claims, 7 Drawing Sheets

(51) Int. Cl.
    *H01L 21/8238*     (2006.01)
    *H01L 27/092*     (2006.01)

(56) References Cited

U.S. PATENT DOCUMENTS

| | | | |
|---|---|---|---|
| 10,553,575 B2* | 2/2020 | Tien | G06F 30/39 |
| 2005/0116268 A1 | 6/2005 | Tahira et al. | |
| 2007/0252217 A1 | 11/2007 | Oki | |
| 2017/0069660 A1* | 3/2017 | Oh | H01L 21/823871 |
| 2017/0116366 A1* | 4/2017 | Seo | G06F 30/23 |
| 2017/0364625 A1 | 12/2017 | Schwarz et al. | |
| 2019/0138682 A1* | 5/2019 | Correale, Jr. | G03F 1/70 |

* cited by examiner

METHOD FOR CHANGING AN INTEGRATED CIRCUIT DESIGN

CROSS-REFERENCE TO RELATED APPLICATIONS

This application claims priority under 35 U.S.C. § 119 to European Patent Application No. 19187358.7, filed on Jul. 19, 2019, the contents of which are incorporated by reference herein.

TECHNICAL AREA

The invention relates to a method for designing an integrated circuit, a method for manufacturing an integrated circuit, and an integrated circuit having spare cells and/or filler cells, wherein the spare cells and/or filler cells are configured as gate-based decoupling cells.

BACKGROUND TO THE INVENTION

Current state of the art integrated circuits may comprise plural types of devices, such as transistors, diodes, capacitors, etc., and plural types of cells, such as functional standard cells, filler cells, spare cells, and decoupling cells.

In the context of the present application, a "cell" refers to an electric circuit consisting of plural devices, which can be reused (or instantiated) in an integrated circuit, which may then be implemented on a wafer, as many times as needed to benefit from the fact that a big number of predefined cells with specific known properties is available and does not need to be created from scratch for every use-case. A very simple example of a cell would be an inverter, which consists of two transistors and has one input signal pin, one output signal pin, and the power supply pins. These cells are normally combined to a bigger library of cells, which may suite many different kinds of purposes, such as for example inverters, buffers, AND gates, OR gates, NAND gates, XOR gates, flip-flops, multiplexers, etc.

Depending on the target use-case, such libraries may also contain uncommon cells, e.g. designed for high voltage ICs. The cells in one library have in common that they are designed such that they can be placed next to each other in the areal design of the IC for efficient area usage, e.g. by making use of continuous well and substrate structures, and such that they may share common power supply rails, etc.

In the context of the present application, a "functional cell" refers to a fully functional standard cell, which means a cell that contains devices and is provided to fulfill the functional requirements of an IC, a circuit, a module, or a block, such as an inverter, a NAND gate, or a flip-flop.

When the functional cells are placed in the design of an integrated circuit, this normally happens in a certain pattern, namely on pattern positions provided by a certain, typically regular, pattern matrix. The placement of functional cells on pattern positions of the pattern matrix is effected for reasons of efficiency, e.g. so as to enable the sharing of wells and substrate rows. However, after the cells have been placed, there may be gaps between those placed cells. In such cases, filler cells are used to "fill" these gaps, which is also made for reasons of efficiency, e.g. to continue supply rails, wells and substrate rows.

In the context of the present application, a "filler cell" refers to a cell, which is placed in a gap between the pattern positions of the pattern matrix that has been designed for the functional cells. As mentioned, the placement of filler cells in gaps between the pattern positions of the pattern matrix is made for reasons of efficiency, e.g. to continue supply rails, wells and substrate rows. Otherwise, these structures would be broken and may cause functional problems, or require bigger cell spacing based on the manufacturing rules. The filler cells may contain floating structures, which are not electrically connected to supply voltages provided by the supply rails, e.g. in the active semiconductor layers or the polysilicon layer, for reasons of easier manufacturability. Filler cells do not contain devices, which contribute to build a certain cell function, but are added only for the reason of filling gaps, as explained.

In the context of the present application, a "spare cell" refers to a cell, which is configured like a functional standard cell, which however is not needed to fulfill the functional requirements of the IC. Spare cells are added in the design of ICs to enable "cheaper" changes to an IC after the IC has already been manufactured. The reason for adding spare cells in the design of ICs is that in testing or on the customer side, errors might occur, which were not found or considered in the simulations performed during the design of the IC. If an error issue can be solved by involving the prepared spare cells, the number of masks to be updated is small (normally only a couple of the metal layers) compared to a full mask set. In addition, the metal masks are normally much cheaper than the deeper layers of the devices, such as the polysilicon, n-well, and active layers, etc., and manufacturing will be faster, because wafers are often stopped and taken out of the manufacturing processing before the metal layers are applied, in order to prepare for these kinds of error fixings. In "extreme" cases, the spare cells could be used to create additional functionality. The possibilities of using spare cells to advantage depend on the number and type of the added spare cells. The concept of using spare cells is normally a trade-off between providing preparedness for fixing issues after manufacturing and the disadvantages associated with spare cells, such as additional area consumption in the IC design and current leakage during operation of the IC.

In the context of the present application, a "decoupling cell" refers to a cell, which is normally a part of the cell library, and which is designed and optimized to provide a maximum of capacity so as to thereby be capable to store a maximum amount of capacitance (or charge). Decoupling cells are provided in an IC design to reduce signal integrity affecting effects, such as e.g. dynamic voltage drop, by smoothening current peaks that are caused by the switching of neighboring or vicinal functional cells or by smoothening drops in the supply voltage when neighboring or vicinal functional cells are switching. As such, a decoupling cell has supply ports, but no signal ports. A decoupling cell can be placed on a regular pattern position for a functional cell in the pattern matrix of the IC. Alternatively, a decoupling cell can be placed in a gap between pattern positions, or in other words between functional cells.

In present days' semiconductor industry, especially in VLSI (Very Large Scale Integration) ICs, spare cells are added to the IC design to allow post manufacturing changes to the IC without regeneration of the complete mask set, but only the masks for the metal layers. This may be needed to correct errors or enable additional functionality. These spare cells occupy area, while they do not have any direct functional purpose, unless they are needed for such a metal ECO (engineering change order).

Current state of the art integrated circuits make use of two kinds of spare cell concepts. The first conventional spare cell concept consists of adding to the design of the IC fully functional standard cells, in order to allow a use of these spare cells in the case of metal ECO, which involves implementing new metal connections to the and within the spare cells. The second conventional spare cell concept consists of placing filler cells with unconnected (or floating) transistors across the IC area. In the case of a metal ECO, the unconnected transistors may need to be cell-internally connected to achieve the required cell functionality, and new external metal connections are implemented so as to integrate the spare cells into the reconfigured design according to the metal ECO. In both conventional spare cell concepts, the spare cells do not have any functional use unless they are required for a metal ECO.

SUMMARY OF THE INVENTION

It is a general object of the present invention to provide on the one hand a more flexible spare cell concept, while on the other hand making functional use of the IC area that is occupied by spare cells of the IC, in particular even if no metal ECO needs to be made. In more detail, it is an object of the present invention to make use of the spare cells to win decoupling capacitance, which is desirable to reduce signal integrity affecting effects and to limit dynamic voltage drop effects, when neighboring functional cells are switching, and to increase the stored on-chip capacitance for contactless IC designs.

According to a first exemplary embodiment of the present invention, there is provided a method for designing an integrated circuit, wherein the integrated circuit is to be structured in cells, and wherein the cells are to comprise functional cells and spare cells. The method comprises:
  a) designing at least one functional cell;
  b) placing a plurality of functional cells on associated pattern positions of an, in particular regular, pattern matrix designed for the functional cells; and
  c) placing, on at least one of the remaining pattern positions of the pattern matrix and instead of at least one spare cell conceivable for the at least one of the remaining pattern positions of the pattern matrix, a gate-based decoupling cell, and/or
  d) placing, in at least one gap between pattern positions of the matrix pattern and instead of at least one filler cell conceivable for the at least one gap between pattern positions of the pattern matrix, a gate-based decoupling cell.

Placing gate-based decoupling cells in the IC design according the step c) and/or the step d) provides additional capacity and allows storing more capacitance in the IC than by regular decoupling cells, which may be conceived in the IC design. In addition, the gate-based decoupling cells, which are added in the IC design according to the invention, may be designed such that the gate-based decoupling cells can be reconfigured in the course of a metal ECO (engineering change order), and as such are further useful to advantage like spare cells.

In an embodiment example of the method, step c) comprises placing, on a plurality of remaining pattern positions of the pattern matrix and instead of a plurality of spare cells conceivable for the plurality of remaining pattern positions of the pattern matrix, an according plurality of gate-based decoupling cells.

In an embodiment example of the method, step d) comprises placing, in a plurality of gaps between pattern positions of the pattern matrix and instead of a plurality of filler cells conceivable for the plurality of gaps between pattern positions of the pattern matrix, an according plurality of gate-based decoupling cells.

In an embodiment example of the method, the at least one gate-based decoupling cell comprises at least one diffusion layer for forming a source region and/or a drain region of a transistor, and a polysilicon layer arranged partially over the at least one diffusion layer. Herein, the polysilicon layer is electrically conductively connected to a supply line of the gate-based decoupling cell, and the at least one diffusion layer is electrically conductively connected to an opposite supply line of the gate-based decoupling cell, such that preferably a capacitance is created between the polysilicon layer connected to the supply line and the diffusion layer connected to the opposite supply line.

In the context of the present application, a "gate-based decoupling cell" refers to a cell, which provides capacity, in particular in addition to a capacity provided by regular convention decoupling cells, and allows storing capacitance in the IC, in particular in addition to the capacitance that is stored by regular convention decoupling cells. Furthermore, and contrary to conventional decoupling cells, gate-based decoupling cells according to the invention are designed such that they are most suitable for a reconfiguration in a metal ECO.

In order to be suitable for a reconfiguration in a metal ECO, the gate-based decoupling cells according to the invention have the following common features and satisfy the following constraints and the requirements for the dimensions of the elements thereof.

1. In order to be suitable for a reconfiguration in a metal ECO, and provide flexibility in respect of the types of functional cells that can be created thereout, the gate-based decoupling cells are designed such that as many transistors as possible can be created on the basis of the polysilicon layer and the p-type and the n-type diffusion layers. In particular, the gate-based decoupling cells may be designed such that there may be created at least two transistors along the length, as seen in the longitudinal direction of the diffusion layers and/or in a direction parallel to the supply lines. This imposes a constraint on the number of polysilicon layers that shall be placed in parallel to each other and to extend over the diffusion layers in a transverse direction to the longitudinal direction of the diffusion layers.

2. Further in order to be suitable for a reconfiguration in a metal ECO, and enable creating thereout many different types of functional cells, the gate-based decoupling cells are preferably designed to have both types of transistors, i.e. p-type transistors and n-type transistors.

3. Further in order to be suitable for a reconfiguration in a metal ECO, the p-type and the n-type diffusion layers of a gate-based decoupling cell preferably extend continuously, i.e. without an interruption or gap, over the whole length of the diffusion layers in the longitudinal direction of the diffusion layers and/or in a direction parallel to the extension direction of the supply lines.

4. The length of the polysilicon layer in the longitudinal direction, which corresponds to the length/width of the gate of a transistor, shall be close to, i.e. somewhat greater than or equal to, the minimum gate width which can be processed according to the manufacturing technology used for the integrated circuit, and shall attain at maximum about two-times the minimum processable gate width.
    This constraint ensures that many transistors can be placed along the longitudinal direction, while the gate width remains small enough so that reasonably short switching times of the transistors can be achieved.

5. The length of the polysilicon layer in the longitudinal direction shall be greater than the length (or width or diameter) of a metal contact via in the longitudinal direction according to the manufacturing technology used for the integrated circuit. For this condition to be satisfied, it may be necessary to design the length of the polysilicon layer in the longitudinal direction somewhat greater than the minimum processable gate width, to attain an extended minimum gate width, at least in a section of the stripe-shaped polysilicon layer.

This constraint ensures that a metal contact via can be placed in/on a polysilicon layer.

6. When a plurality of polysilicon layers are placed in parallel to each other and to extend over the p-type diffusion layer in a transverse direction that is perpendicular to the longitudinal direction, then there shall be remaining free (i.e. uncovered by the polysilicon layer) lengths of sections of the p-type diffusion layer, as seen in the longitudinal direction, wherein each one of the remaining free lengths is greater than the length (or width or diameter) of a metal contact via and/or greater than the length (or width) of a first layer metal (M1).

Likewise, when a plurality of polysilicon layers are placed in parallel to each other and to extend over the n-type diffusion layer in a transverse direction that is perpendicular to the longitudinal direction, then there shall be remaining free (i.e. uncovered by the polysilicon layer) lengths of sections of the n-type diffusion layer, as seen in the longitudinal direction, wherein each one of the remaining free lengths is greater than the length (or width or diameter) of a metal contact via and/or greater than the length (or width) of a first layer metal (M1).

These two constraints ensure that a metal contact via and/or a first layer metal (M1) can be placed between two stripe-shaped polysilicon layers and/or on each side of each one of the stripe-shaped polysilicon layers.

In an embodiment example of the method of first exemplary embodiment of the present invention, the method further comprises:
verifying the fulfilling of all design- and process-wise requirements of the designed integrated circuit, including that of the functional cells and the at least one gate-based decoupling cell.

In an embodiment example of the method, the method further comprises:
e) reconfiguring at least one of the gate-based decoupling cells in the course of a metal engineering change order.

In a particular embodiment of this embodiment example, step e) comprises:
e.i) determining a suitable new cell function for the at least one gate-based decoupling cell, and
e.ii) reconfiguring contact layers and metal layers of the at least one gate-based decoupling cell, so as to implement the determined new cell function of the reconfigured at least one gate-based decoupling cell.

In a particular embodiment of the two embodiment examples mentioned hereinbefore, the reconfiguring of the at least one gate-based decoupling cell comprises:
removing the contact and/or metal layers, which created the decoupling function of the at least one gate-based decoupling cell, and
adding new contact and/or metal layers, which create a desired suitable new cell function of the reconfigured at least one gate-based decoupling cell.

In an embodiment example of the method, the reconfiguring of the at least one gate-based decoupling cell is performed manually by an integrated circuit design engineer.

In an alternative embodiment example of the method, the reconfiguring of the at least one gate-based decoupling cell comprises selecting a design for a suitable new cell function of the reconfigured at least one gate-based decoupling cell from a library.

In a particular embodiment of the five embodiment examples mentioned hereinbefore, the method further has:
verifying the fulfilling of all design- and process-wise requirements of the integrated circuit that has been reconfigured in the course of the metal engineering change order, including that of the functional cells and the at least one reconfigured gate-based decoupling cell.

According to a second exemplary embodiment example of the present invention, there is provided a method for manufacturing an integrated circuit, wherein the integrated circuit is structured in cells, and wherein the cells are to comprise functional cells and spare cells and/or filler cells. The method comprises:
A) manufacturing a plurality of functional cells on respective associated pattern positions of an, in particular regular, pattern matrix designed for the functional cells; and
B) manufacturing, on at least one of the remaining positions of the pattern matrix and instead of a spare cell conceivable for the at least one of the remaining positions of the pattern matrix, at least one gate-based decoupling cell;
and/or
C) manufacturing, in at least one gap between pattern positions of the pattern matrix and instead of a filler cell conceivable for the at least one gap between pattern positions of the pattern matrix, at least one gate-based decoupling cell.

The manufacturing of gate-based decoupling cells in the IC according the step B) and/or the step C) provides the same advantages as those described above for the placing of gate-based decoupling cells in the IC design according the step c) and/or the step d) of the method for designing the integrated circuit described above.

In an embodiment example of the method, step B) comprises placing, on a plurality of remaining pattern positions of the pattern matrix and instead of a plurality of spare cells conceivable for the plurality of remaining pattern positions of the pattern matrix, an according plurality of gate-based decoupling cells.

In an embodiment example of the method, step C) comprises placing, in a plurality of gaps between pattern positions of the pattern matrix and instead of a plurality of filler cells conceivable for the plurality of gaps between pattern positions of the pattern matrix, an according plurality of gate-based decoupling cells.

In an embodiment example of the method, the at least one gate-based decoupling cell comprises at least one diffusion layer for forming a source region and/or a drain region of a transistor, and a polysilicon layer arranged partially over the at least one diffusion layer. Herein, the polysilicon layer is electrically conductively connected to a supply line of the gate-based decoupling cell, and the at least one diffusion layer is electrically conductively connected to an opposite supply line of the gate-based decoupling cell, such that preferably a capacitance is created between the polysilicon layer connected to the supply line and the diffusion layer connected to the opposite supply line.

In an embodiment example of the method, the at least one gate-based decoupling cell is configured such that it is capable to be reconfigured, in the course of a metal engineering change order, to attain a suitable new cell function.

In a particular embodiment of this embodiment example, the reconfiguring in the course of a metal engineering change order comprises:
  i) determining a suitable new cell function for the at least one gate-based decoupling cell, and
  ii) reconfiguring contact layers and metal layers of the at least one gate-based decoupling cell, so as to implement the determined new cell function of the reconfigured at least one gate-based decoupling cell.

In a particular embodiment of the two embodiment examples mentioned hereinbefore, the reconfiguring of the at least one gate-based decoupling cell comprises:
  removing the contact and/or metal layers, which created the decoupling function of the at least one gate-based decoupling cell, and
  adding new contact and/or metal layers, which create a desired suitable new cell function of the reconfigured at least one gate-based decoupling cell.

In an embodiment example of the method, the reconfiguring of the at least one gate-based decoupling cell is performed manually by an integrated circuit design engineer.

In an alternative embodiment example of the method, the reconfiguring of the at least one gate-based decoupling cell comprises selecting a design for a suitable new cell function of the reconfigured at least one gate-based decoupling cell from a library.

According to a third exemplary embodiment example of the present invention, there is provided an integrated circuit, wherein the integrated circuit is structured in cells, and wherein the cells comprise functional cells and spare cells and/or filler cells. The integrated circuit comprises:
  A) a plurality of functional cells arranged on respective associated pattern positions of an, in particular regular, pattern matrix designed for the functional cells; and
  B) at least one gate-based decoupling cell, provided on at least one of the remaining positions of the pattern matrix and instead of a spare cell conceivable for the at least one of the remaining positions of the pattern matrix;
  and/or
  C) at least one gate-based decoupling cell, provided in at least one gap between pattern positions of the pattern matrix and instead of a filler cell conceivable for the at least one gap between pattern positions of the pattern matrix.

The provision of gate-based decoupling cells in the IC provides the same advantages as those described above for the placing of gate-based decoupling cells in the IC design according the step c) and/or the step d) of the method for designing the integrated circuit described above.

In an embodiment example of the integrated circuit, the integrated circuit comprises, on a plurality of remaining pattern positions of the pattern matrix and instead of a plurality of spare cells conceivable for the plurality of remaining pattern positions of the pattern matrix, an according plurality of gate-based decoupling cells.

In an embodiment example of the integrated circuit, the integrated circuit comprises, in a plurality of gaps between pattern positions of the pattern matrix and instead of a plurality of filler cells conceivable for the plurality of gaps between pattern positions of the pattern matrix, an according plurality of gate-based decoupling cells.

In an embodiment example of the integrated circuit, the at least one gate-based decoupling cell comprises at least one diffusion layer for forming a source region and/or a drain region of a transistor, and a polysilicon layer arranged partially over the at least one diffusion layer. Herein, the polysilicon layer is electrically conductively connected to a supply line of the gate-based decoupling cell, and the at least one diffusion layer is electrically conductively connected to an opposite supply line of the gate-based decoupling cell, such that preferably a capacitance is created between the polysilicon layer connected to the supply line and the diffusion layer connected to the opposite supply line.

In an embodiment example of this integrated circuit, the at least one gate-based decoupling cell is, and preferably all of the gate-based decoupling cell are, configured such that it is/they are capable to be reconfigured, in the course of a metal engineering change order, to attain a suitable new cell function.

BRIEF DESCRIPTION OF THE DRAWINGS

In the following, exemplary embodiment examples of the present invention are described in detail with reference to the following drawings.

Similar or like components in different figures are provided with the same reference numerals. For reasons of conciseness, features, which have been described with respect a particular figure, may not be described again, if they appear likewise or similarly in another figure.

DETAILED DESCRIPTION OF PREFERRED EMBODIMENTS

Figure 1:
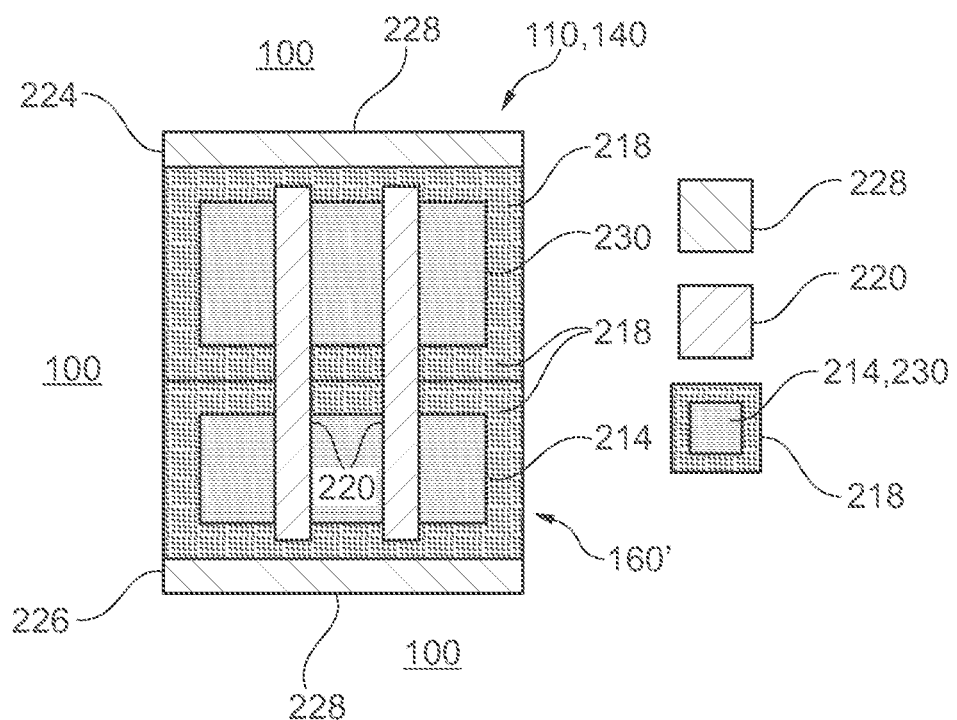
FIG. 1 illustrates a top view of a filler cell having four transistors and floating structures, according to a first embodiment that does not implement the present invention.

Before exemplary embodiment examples of the invention are described with reference to the figures, some general aspects of the invention as proposed by the present inventors shall still be explained.

According to the invention, there is provided a new a spare cell approach, which is more flexible than the conventionally known spare cell approaches described in the beginning above. According to the invention, gate-based decoupling cells are added, either instead of conventional spare cells and on regular pattern positions of the pattern matrix of the IC to be designed, or instead of conventional filler cells and in gaps between regular pattern positions of the pattern matrix of the IC. These gate-based decoupling cells are configured such that they can be reconfigured, if required by a metal ECO.

While the insertion of conventional decoupling cells is a common step, conventional decoupling cells cannot be used and reconfigured in the same as can the gate-based decoupling cells according to the present invention. This is because the layout of conventional decoupling cells is optimized to provide as much capacity as possibly, in particular to store as much capacitance or charge as possible, which is achieved e.g. by using a polysilicon "plate" instead of the stripe-shaped polysilicon structures 220 illustrated for example in the FIGS. 5, 6 and 7. Such a polysilicon plate is not suited to form a reasonable transistor gate, because such a gate would be too large and cause too slow switching times for the transistor.

The gate-based decoupling cells according to the invention are configured such that one the one hand, they provide some capacity, or in other words some capacitance or capability to store some charge, and thus have a functional use, even if no metal ECO becomes necessary lateron. On the other hand, the gate-based decoupling cells according to the invention are configured such that they can be reconfigured to become a functional cell, if required by a metal ECO.

The advantage of providing gate-based decoupling cells according to the invention compared to the known approach of using ECO filler cells is that the gate-based decoupling cells according to the invention provide decoupling capacitance. The advantage of providing gate-based decoupling cells compared to adding unused fully functional cells as spare cells is that the cell function of the gate-based decoupling cells is not predefined and can be chosen based on the metal ECO requirements, and of course again the additional capacity and stored capacitance.

It is conceived that a metal ECO is the only reason for reconfiguring the gate-based decoupling cells according to the invention. ICs are prepared for metal ECOs because of the lower costs of the metal masks and the faster manufacturing. This is because the metal masks are usually the later processing steps, and wafers may be kept on hold before the metal layers.

In case that a full mask ECO would be required, e.g. to correct for an error in the IC design, there is no need to limit the changes to the metal layers only. A full mask ECO gives a lot of freedom for all kind of updates—spare cells would not be needed in this case. But from cost perspective, an unplanned full mask ECO would be a too expensive and hence not desirable operation, because the mask costs for the deeper layers, such as the polysilicon or the diffusion layers, etc., are much higher and none of the prepared wafers could be reused.

By contrast, in a metal ECO, all design updates are implemented to keep the changes in the metal masks only. Metal masks are much cheaper than the masks forming the transistors, and a common approach is to stop several wafers before the metal layers are processed. In this way, the run time during the manufacturing is very short for a metal update.

If a gate-based decoupling cell is to be reconfigured in the course of a metal ECO, the technical steps involved in the reconfiguration comprise basically figuring out a suitable new cell function for the metal ECO, and then updating the contact and the metal layers of the gate-based decoupling cell to implement the necessary new function. The preferred way is to not do this manually, although this is possible, but rather replace the gate-based decoupling cells by cells taken out of a prepared library.

In testing or on the customer side, errors might pop up, which were not found or considered in the course of simulations performed during the IC design. After an issue has been found, e.g. during IC testing, the issue is investigated, and a solution is worked out. In a very simple example, an inverter would be needed to use the inverted version instead of the original signal. So, one reconfigurable gate-based decoupling cell at an appropriate location would be chosen to be changed to an inverter. The change could be implemented manually, by removing the contacts creating the decoupling function and adding the contacts and metals needed for the inverter. A better approach is to have a library with cells available, which can replace the decoupling cell in the design. These cells are needed to be designed such that the difference to the gate-based decoupling cells is only in the layers above the polysilicon layer.

FIG. 1 illustrates a top view of a cell 110, which is embedded in an integrated circuit 100, and which is simplified example of a conventional filler cell 140, which has four unconnected transistors, i.e. floating structures.

Figure 2:
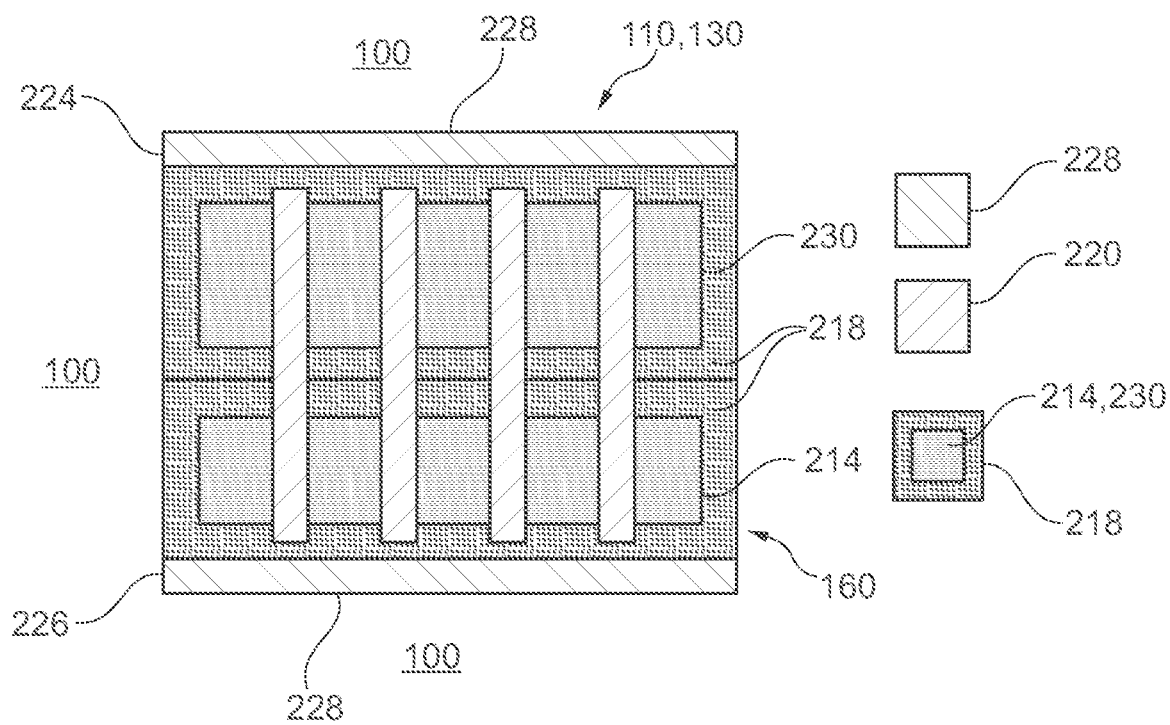
FIG. 2 illustrates a top view of a filler cell having eight transistors and floating structures, according to a second embodiment that does not implement the present invention.

The exemplifying conventional filler cell 140 shown in FIG. 1 comprises a p-type diffusion region 230, which may be embedded in an n-well trench (not shown) as shown in the upper portion of the cell 110 shown in FIG. 1, and an n-type diffusion region 214, which may be embedded in a p-well trench 204 as shown in the lower portion of the cell 110 shown in FIG. 1 and as shown in a cross-sectional view in FIG. 2. The p-type diffusion region 230 and the n-type diffusion region 214 may be surrounded by an oxide layer 218, as shown in FIG. 1 and as shown for the n-type diffusion region 214 shown in the cross-sectional view in FIG. 2. The filler cell 140 of FIG. 1 further comprises two polysilicon layers 220, each of which is stripe-shaped in the top view of FIG. 1, and extends across and over both the p-type diffusion region 230 and the n-type diffusion region 214, as is also shown for the n-type diffusion region 214 in the cross-sectional view in FIG. 2.

The conventional filler cell 140 of FIG. 1 further comprises a supply line 224, which may represent the power supply line (PWR) of the cell 110, and an opposite supply line 226, which may represent the voltage ground line (GND) of the cell 110. Both supply lines 224, 226 may be embodied only as a first, or lowest, layer metal (or M1 layer) 228, where the expression "lowest" and "M1" refer to the lowest metal layer present in the layer-wise construction of a transistor as shown in the cross-sectional view of a transistor 200 in FIG. 2. In other embodiments, the supply lines 224, 226 may be embodied in the lowest (M1) metal layer and in the next-to-lowest (M2) metal layer on top of each other, or even still further metal layers (M3, M4, . . . ) on top of each other, as may be required to reduce the ohmic resistance of the supply lines 224, 226 to a desired level.

The four transistors comprised in the simplified conventional filler cell 140 shown in FIG. 1 are formed by the overlap of the stripe-shaped polysilicon layers 220 with the diffusion layers 214, 230. Two p-type transistors are formed by the overlap of the stripe-shaped polysilicon layers 220 with the p-type diffusion layer 230, and two n-type transistors are formed by the overlap of the stripe-shaped polysilicon layers 220 with the n-type diffusion layer 214.

Figure 4:
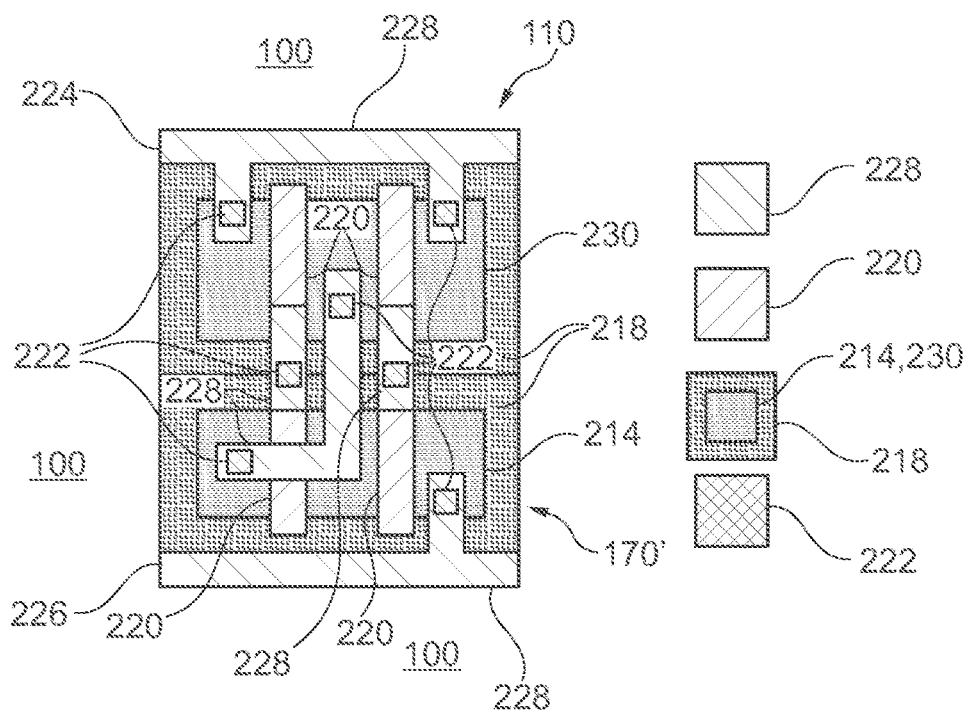
FIG. 4 illustrates a top view of the reconfigured filler cell of FIG. 1, reconfigured as a NAND gate, according to an embodiment that does not implement the present invention.

As can be taken from FIG. 1, neither the p-type nor the n-type diffusion layers 230, 214, nor the polysilicon layers 220 are connected to the supply lines 224, 226. Accordingly, the conventional filler cell 140 comprises four unconnected transistors, and as such is prepared for a reconfiguration of the filler cell 140 in the course of a metal ECO, if needed, as shown in FIG. 4. It is noted that a wider range of cells, which may provide more or fewer floating transistors, and different relative geometrical dimensions in the projection to the plane of FIG. 1, such as lengths and widths of the structures 214, 230, 218, 220, 224, 226 shown in FIG. 1, can be used to enable creating also more complex cells, before and after a possibly necessary reconfiguration in a metal ECO.

By way of example for a cell having more transistors and being more complex, FIG. 2 illustrates a top view of a filler cell 140 having eight unconnected (floating) transistors. In FIG. 2, four p-type transistors are formed by the overlap of the stripe-shaped polysilicon layers 220 with the p-type diffusion layer 230, and four n-type transistors are formed by the overlap of the stripe-shaped polysilicon layers 220 with the n-type diffusion layer 214.

It is noted that in the FIGS. 1 and 2, and likewise in the FIGS. 4 to 11, the elements first metal layer (M1) 228, polysilicon 220 layer, p-type diffusion layer 230, n-type diffusion layer 214, and metal contact via 222, rather than representing elements of cell 110 of an integrated circuit, can alternatively be considered to represent layout and/or mask layers, which result from performing the design of the cell 110, and which may be used for manufacturing the integrated circuit 100. It is further noted that in the FIGS. 1, 2, and 4 to 11, not all layout layers and not all mask relevant layers are shown, but only those mask layers that are deemed necessary to describe and understand the present invention.

Figure 3:
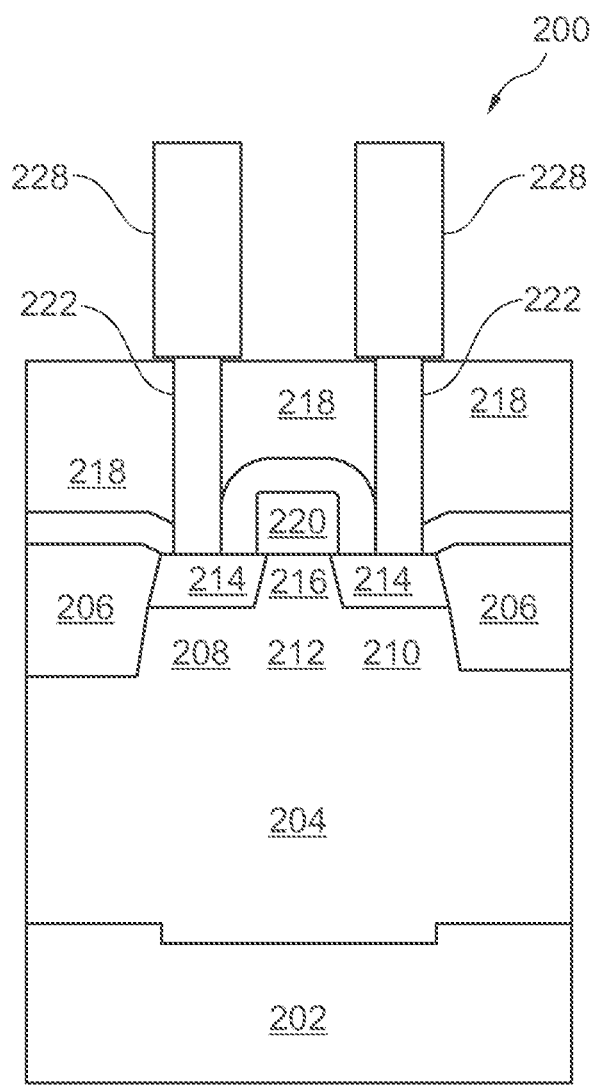
FIG. 3 illustrates a cross-sectional view of a transistor, which may be implemented in the cells shown in FIGS. 1, 2, and 4 to 10, according to an embodiment that does not implement the present invention.
Figure 7:
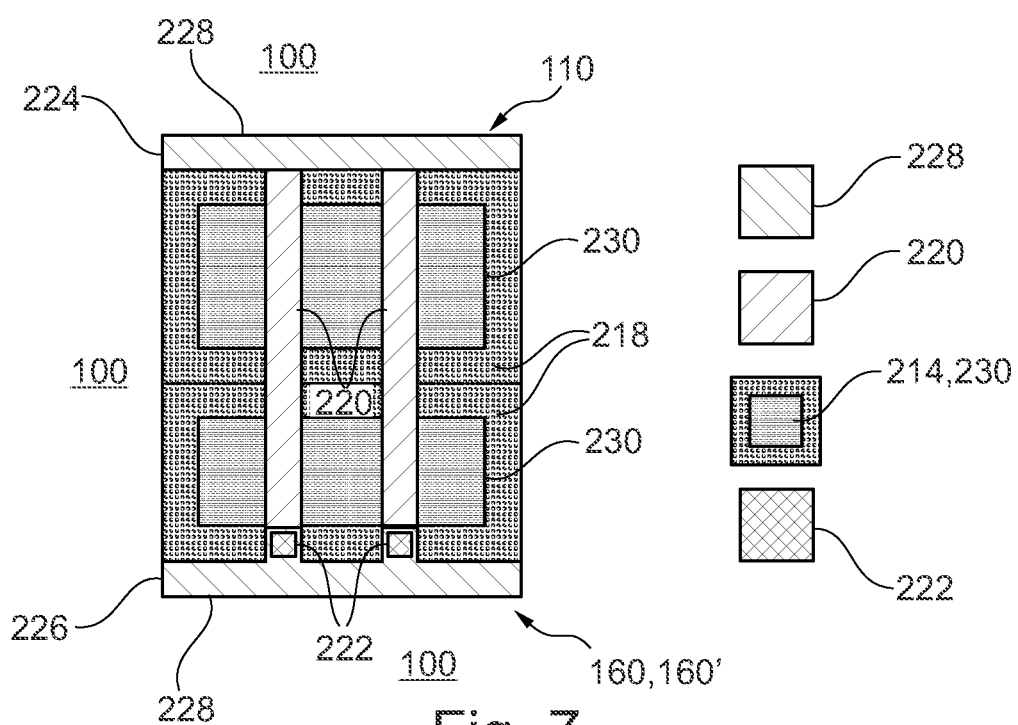
FIG. 7 illustrates a top view of a gate-based decoupling cell, according to a third exemplary embodiment of the present invention.
Figure 8:
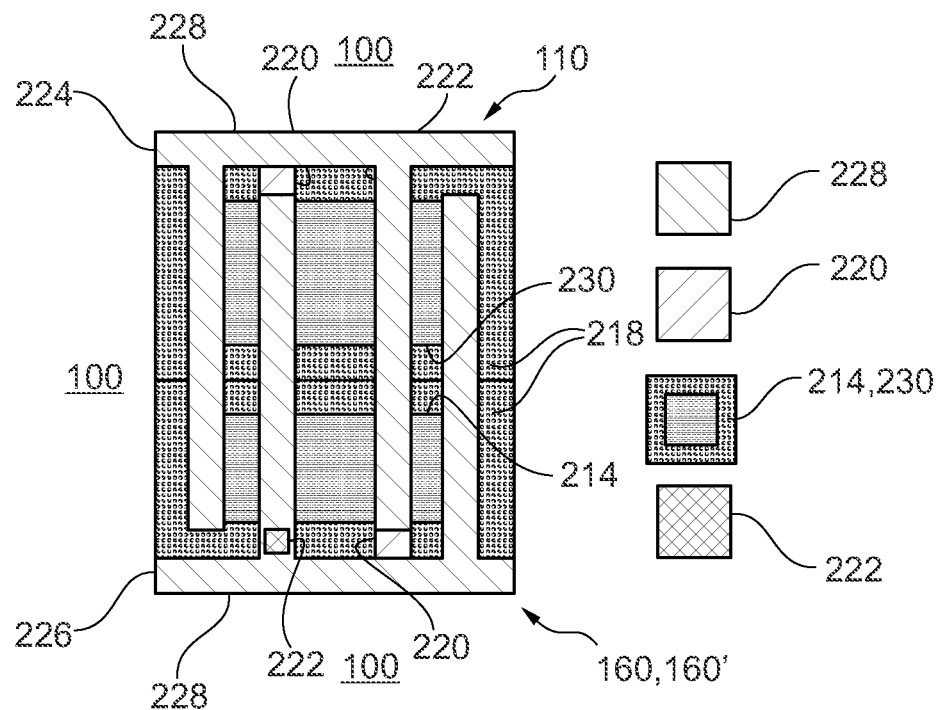
FIG. 8 illustrates a top view of a gate-based decoupling cell, according to a fourth exemplary embodiment of the present invention.
Figure 9:
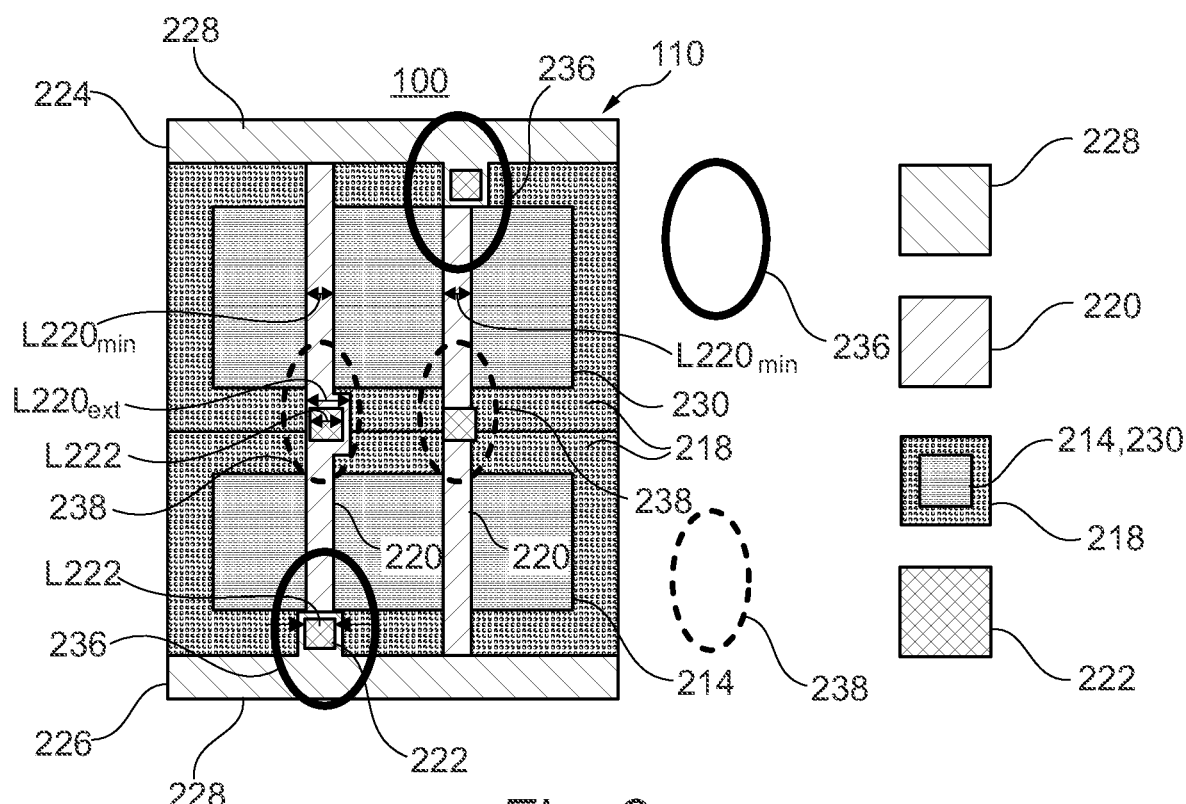
FIG. 9 illustrates a top view of a gate-based decoupling cell, with indications of structural dimensions, according to a fifth exemplary embodiment of the present invention.
Figure 10:
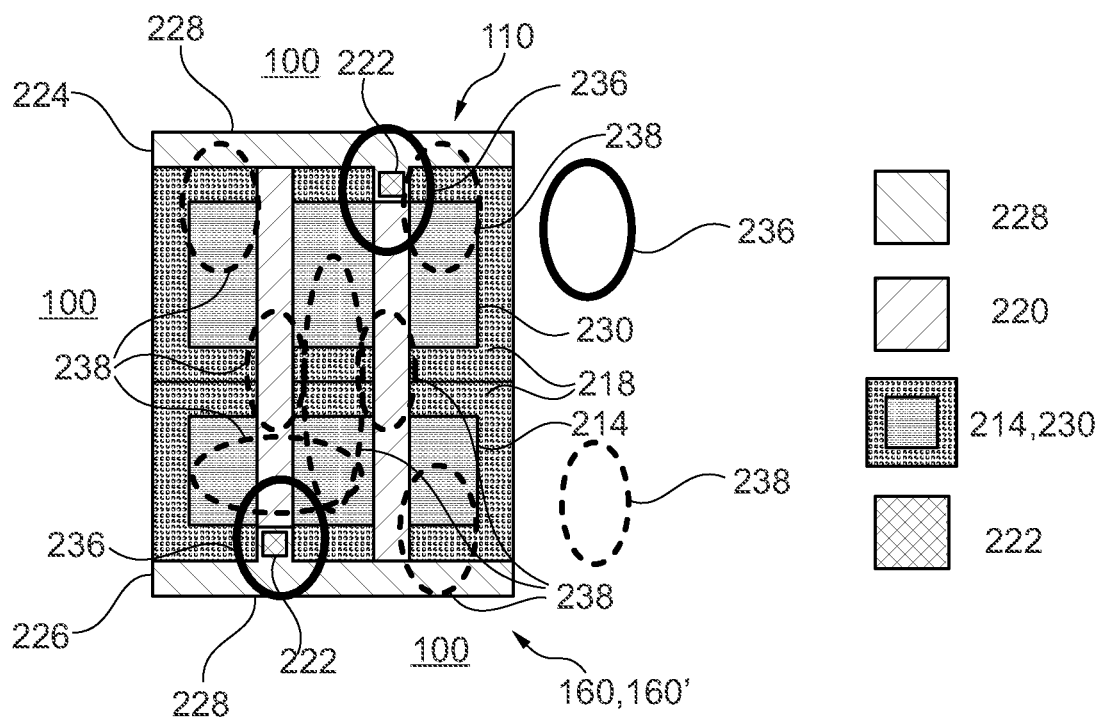
FIG. 10 illustrates a top view of an example of how the gate-based decoupling cell of FIG. 6 can be reconfigured, according to an exemplary embodiment of the present invention.

FIG. 3 illustrates a cross-sectional view of a transistor 200, which may be implemented in the filler cells 140 shown in FIGS. 1 and 2, and in the cells 110 shown in FIG. 4 (illustrating a reconfigured gate-based coupling cell 170' obtained from the filler cell 140 in FIG. 1), in FIGS. 5 to 8 (illustrating a gate-based coupling cell 160, 160'), and in FIGS. 9 and 10 (illustrating the reconfiguration of a gate-based coupling cell 160, 160' in FIG. 9 to a reconfigured gate-based coupling cell 170, 170' in FIG. 10).

The transistor 200 of FIG. 3 is an example of a conventional n-type transistor, which is manufactured on a wafer and comprises the wafer 202; a p-well 204 formed in the wafer 202, which is doped so as to comprise electrically positive movable charge carriers, i.e. holes as the majority charge carriers; and a shallow trench isolation (STI) 206, which is formed to surround and horizontally isolated the p-well 204. In the p-well 204, there is conceived a source region 208, a drain region 210 and a bridge region 212 located between the drain region 210 and the source region 212, where it is be noted that the particular source and drain regions do form only during operation of the transistor 200 as a function of the applied electric potential and namely the polarities thereof. Furthermore, in the p-well 204, there have been formed, by patterned ionization, two n-type diffusion regions (or $n^+$-regions) 214. The transistor 200 further comprises a layer of polysilicon 220, which forms the gate of the transistor 200 and is arranged to partially cover each one of the n-type diffusion regions 214 and to bridge from the one to the other n-type diffusion region 214. An oxide layer 218 covers the shallow trench isolation 206, the n-type diffusion regions 214 and the polysilicon 220 layer, and surrounds and isolates the metal contact vias 222.

For the contacting, the transistor 200 further comprises two metal contact vias 222, one of the contact vias 222 (e.g. the left one shown in FIG. 3) being associated to and contacting one of the n-type diffusion regions 214 (e.g. the left one shown in FIG. 3), and the other one of the contact vias 222 (e.g. the right one shown in FIG. 3) being associated to and contacting the other one of the n-type diffusion regions 214 (e.g. the right one shown in FIG. 3). Furthermore, the transistor 200 comprises two first layer metal (M1) 228, each one arranged above the oxide layer 218 for contacting an associated one of the metal contact vias 222.

In operation of the n-type transistor 200, if a potential or voltage, which is positive with respect to the potential applied to the conceived source region 208, is applied to the polysilicon 220 layer or gate, the associated electric field draws electrons from the p-well 204 layer into the zone between the n-type diffusion regions 214, thereby forming the channel region 216 of the transistor 200, through which an electric current formed by electrons is enabled to flow from the one n-type diffusion region 214 (source region 208) to the other one (drain region 210), and thus from the one first layer metal (M1) 228 to the other one. This electric current can be switched and adjusted by switching and adjusting the potential applied to the polysilicon layer 220 forming the gate of the n-type transistor.

It is noted that also conventional p-type transistors are necessarily present in gate-based decoupling cells 160, 160' according to the invention, as indicated for example in FIGS. 5 to 9 as will be described later. While a p-type transistor is not shown in the Figures, it can be described on the basis of the n-type transistor shown in FIG. 3 as follows. In a p-type transistor, the wafer 202, the shallow trench isolation 206, the oxide layer 218, the polysilicon 220 layer (or gate), the metal contact vias 222, and first layer metal (M1) 228 are essentially similar to the corresponding elements 202, 206, 218, 220, 222, and 228, which are present in an n-type transistor 200 and shown in FIG. 3. What is different in a p-type transistor as compared to an n-type transistor is the following:

1) Instead of a p-well 204 being doped to comprise electrically positive movable charge carriers, i.e. holes as the majority charge carriers, as present in an n-type transistor 200, a p-type transistor (not shown in FIG. 3) comprises an n-well (not shown in FIG. 3) being doped so as to comprise electrically negative movable charge carriers, i.e. electrons as the majority charge carriers.
2) Instead of two n-type diffusion regions (or $n^+$-regions) 214 being formed in the p-well 204 by patterned ionization, as present in an n-type transistor 200, a p-type transistor (not shown in FIG. 3) comprises two p-type diffusion regions (or $p^+$-regions) 230 (not shown in FIG. 3) being formed in the p-well 204 by patterned ionization.
3) In operation of the p-type transistor, if a potential or voltage, which is negative with respect to the potential applied to the conceived source region, is applied to the polysilicon layer or gate, the associated electric field draws holes from the n-well layer into the zone between the p-type diffusion regions 230, thereby forming a channel region of the p-type transistor 200, through which an electric current formed by holes is enabled to flow from the one p-type diffusion region 230 (which thus becomes the source region) to the other one (which thus becomes the drain region), and thus from the one first layer metal (M1) to the other one. This electric current can be switched and adjusted by switching and adjusting the potential applied to the polysilicon layer forming the gate of the p-type transistor.

For a more complete description of transistors, the different transistor types, the structural composition of transistors according to different transistor types, and the functioning thereof in operation, reference is made, by way of example, to a standard text book in the German language by Ulrich Tietze and Christoph Schenk, "Halbleiter-Schaltungstechnik" (English translation: "Semiconductor Technology"), Springer, $13^{th}$ newly revised edition 2010 (15 Oct. 2009), ISBN-13: 978-3642016219, which is incorporated herein by reference in its entirety.

Now with reference to FIG. 4, if for a conventional filler cell, such as the exemplifying conventional filler cell 140 shown in FIG. 1, there arises the need to implement a design update or a correction to a design error by a metal ECO, the floating transistors of the conventional filler cell can be connected by using the contact layer, viz. metal contact vias 222, and cell pins, and cell-internal connections can be established by using first metal layers (M1) 228 (sometimes also called metal wires). The positions of the contacts 222 and cell pins and the cell-internal connections by metal layers (M1) 228 then define the type of e.g. functional cell, which is created from the filler cell 140.

By way of example, FIG. 4 illustrates a top view of the filler cell 140 of FIG. 1, which has been reconfigured as a NAND gate having two inputs, as an example for a reconfigured filler cell 170'.

The contacts (or metal contact vias) 222 are applied to connect to the gate and source connections of the transistors that are formed in the two diffusion regions 214, 230 and to the gate connections (the polysilicon 220 layers) of the transistors, while first metal layers (M1) 228 are used to create cell pins and cell-internal connections. By updating the metal connections 228 to other, external cells of the IC, the reconfigured filler cells, as newly created cells, can be integrated into the design of the IC, as needed. It is noted that while the use of first metal layers 228 for creating connections is preferred, also higher metal layers (M2, M3, . . . ) may be used to establish the necessary cell internal connections, and that also neighbouring filler cells may be combined to create more complex cells, which require a higher number of transistors.

By contrast to the exemplifying conventional reconfigurable filler cells 140 having floating transistors shown in FIGS. 1, 2, and 4, the following FIGS. 5 to 11 show exemplifying embodiment examples of gate-based filler cells 160, 160' according to the invention.

Figure 5:
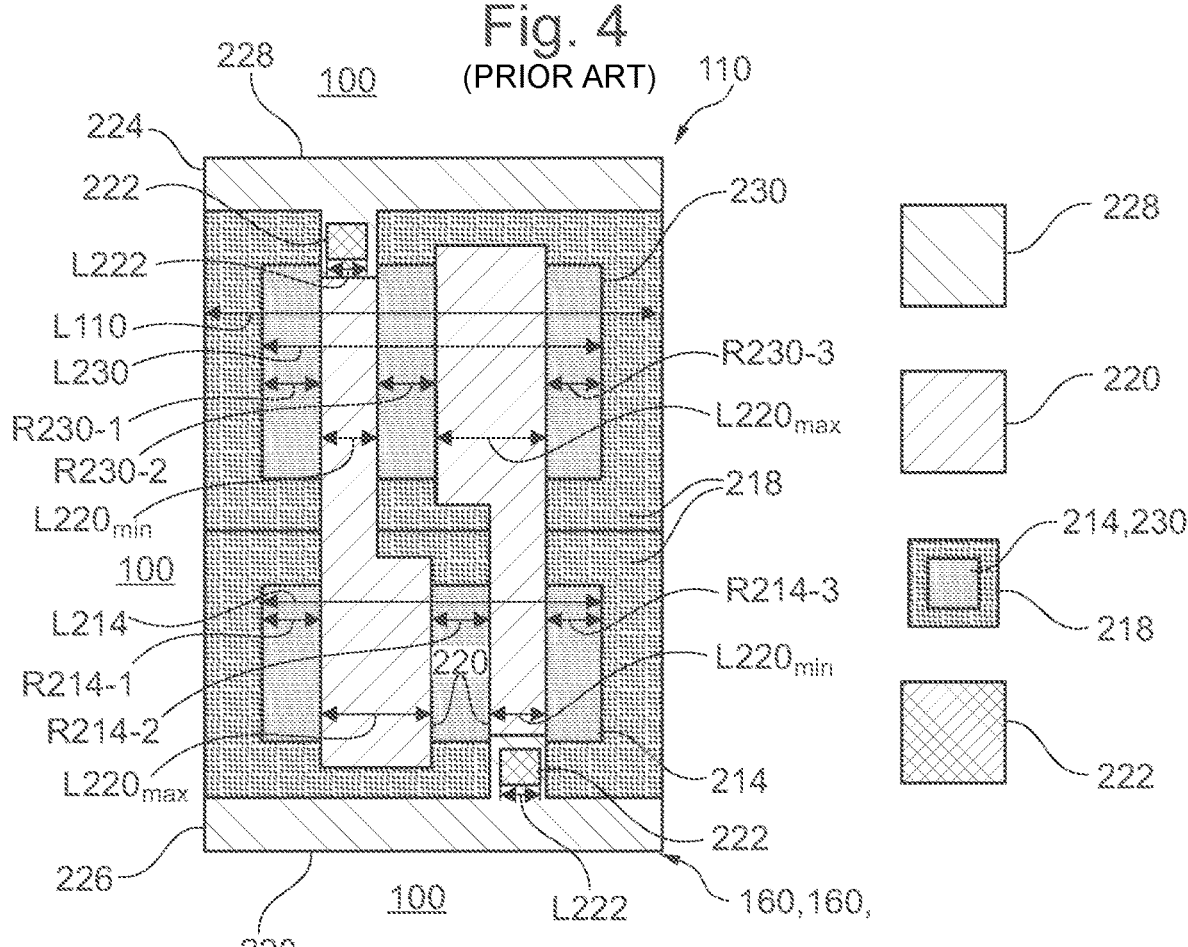
FIG. 5 illustrates a top view of a gate-based decoupling cell, with indications of structural dimensions, according to a first exemplary embodiment of the present invention.

FIG. 5 illustrates a top view of a gate-based decoupling cell 160, 160', with indications of structural dimensions, according to a first exemplary embodiment of the present invention.

The gate-based decoupling cell 160, 160' of FIG. 5 comprises a first polysilicon 220 layer (e.g. the left one in FIG. 5) that is connected via a first metal contact via 222 (e.g. the upper one in FIG. 5) to a first M1 layer metal 228 that is connected to one supply line 224 (e.g. the upper one in FIG. 5), and a second polysilicon 220 layer (e.g. the right one in FIG. 5) that is connected via a second metal contact via 222 (e.g. the lower one in FIG. 5) to a second M1 layer metal 228 that is connected to the opposite supply line 226 (e.g. the lower one in FIG. 5). As such, the gate-based decoupling cell 160, 160' of FIG. 5 comprises p-type transistors and n-type transistors, one of each type.

Figure 6:
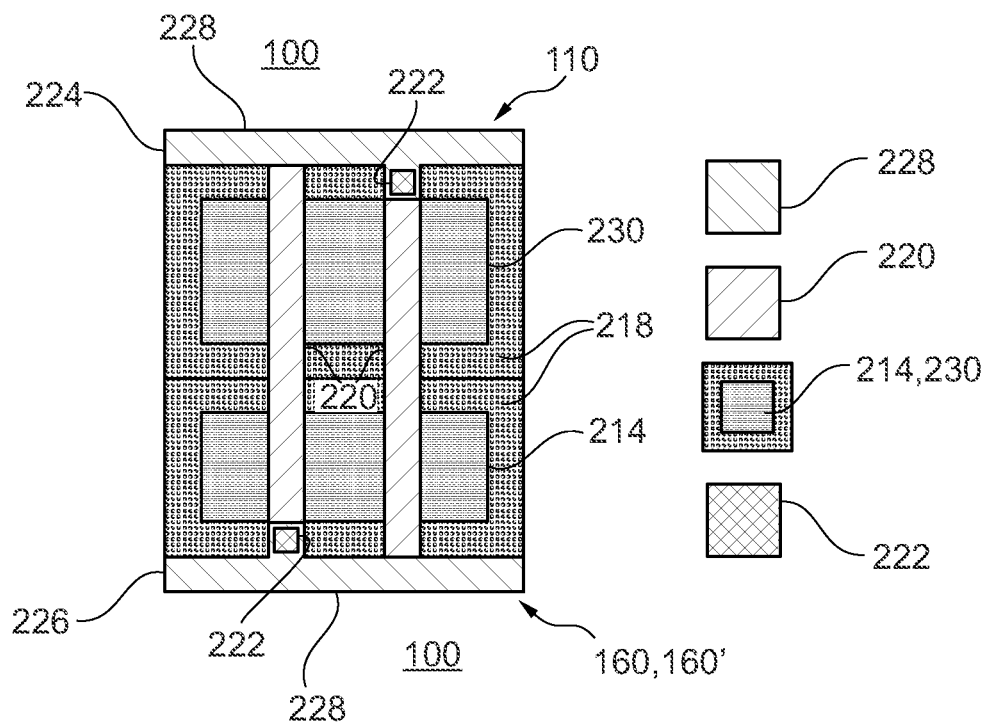
FIG. 6 illustrates a top view of a gate-based decoupling cell, according to a second exemplary embodiment of the present invention.

The capacity/capacitance of the gate-based decoupling cell 160, 160' of FIG. 5, and likewise that of the cells 160, 160' of FIGS. 6 to 8, is built up between the transistor gates formed by the polysilicon 220 layer connected to one supply line 224, which may be connected e.g. power or ground, and the diffusion layer 214, 230 connected to the opposite supply line 226, which may be connected e.g. ground or power, respectively. The connections to the diffusion layers 214, 230 may be implemented inside or outside of the gate-based decoupling cell 160, 160', and is therefore not shown in FIG. 5 (and likewise not shown in FIGS. 6 to 11), thereby recalling of what has been said already above that not all layout layers and not all mask relevant layers are shown in FIGS. 1, 2, and 4 to 11.

It is noted that the layout of the gate-based decoupling cell 160, 160' shown in FIG. 5 may include more or fewer transistors than shown in FIG. 5. Also, the transistor size can be varied, which may include varying the dimensions of the p-type diffusion layer 230, the n-type diffusion layer 214, the polysilicon 220 layer, the metal contact via 222, and the first layer metal (M1) 228. It is also possible, while one or more transistors of the complementary type are present, to use only p-type transistors or only n-type transistors to create the decoupling capacity.

The layout/design of the gate-based decoupling cell 160, 160' and the choice of the decoupling cell concept will be made depending on the combination of design constraints and requirements as well as the DRC (design rule check) rules to be applied, which may determine distances of layer structures relative to each other, layer lengths (or widths), densities, gradients, overlaps, etc. and includes the verification whether all manufacturing rules provided by the manufacturer (or fabrication systems) are fulfilled. Characteristic common features of gate-based transistors 160, 160' according to the invention as well as constraints and requirements for the dimensions of the elements (viz. p-type diffusion layer 230, the n-type diffusion layer 214, the polysilicon 220 layer, the metal contact via 222, and the first layer metal (M1) 228) of gate-based transistors 160, 160' according to the invention, and how these distinguish from conventional decoupling cells, are discussed with reference to FIG. 5 and to FIG. 9 further below following the description of FIG. 9.

If the gate-based decoupling cell 160, 160' shown in FIG. 5 satisfies the characteristic common features of gate-based transistors 160, 160' according to the invention as well as the constraints and the requirements for the dimensions of the elements thereof, the gate-based decoupling cell 160, 160' can be reconfigured, if needed, for a metal ECO.

FIG. 6 illustrates a top view of a gate-based decoupling cell 160, 160', according to a second exemplary embodiment of the present invention.

The gate-based decoupling cell 160, 160' shown in FIG. 6 differs from the gate-based decoupling cell 160, 160' shown in FIG. 5 essentially in respect of the width and shape of the polysilicon 220 layers and hence the size of the overlap with the diffusion layers 214, 230.

As in the gate-based decoupling cell 160, 160' shown in FIG. 5, also in the gate-based decoupling cell 160, 160' shown in FIG. 6, the capacity/capacitance is built up between the transistor gates formed by the polysilicon 220 layer connected to one supply line 224, which may be connected e.g. power or ground, and the diffusion layer 214, 230 connected to the opposite supply 226, which may be connected e.g. ground or power, respectively.

Further layout variations of the gate-based decoupling cell 160, 160' shown in FIG. 6 are possible, as is illustrated e.g. in FIG. 7.

FIG. 7 illustrates a top view of a gate-based decoupling cell 160, 160', according to a third exemplary embodiment of the present invention.

The gate-based decoupling cell 160, 160' shown in FIG. 7 differs from the gate-based decoupling cell 160, 160' shown in FIG. 6 in that only p-type transistors (and accordingly only p-type diffusion layers 230) are used, and further in respect of the connection of the one and the other polysilicon 220 layer to the supply lines, namely in that in FIG. 7 both polysilicon 220 layers are connected to the same supply line 226. In order that the capacity/capacitance is built up between the transistor gates formed by the polysilicon 220 layers connected to one supply line (e.g. the lower one 226 in FIG. 7) and the diffusion layers 230 connected to the opposite supply line (i.e. the upper one 224 in FIG. 7), the diffusion layers 230 are connected to the supply line 224 (not shown in FIG. 7).

FIG. 8 illustrates a top view of a gate-based decoupling cell 160, 160', according to a fourth exemplary embodiment of the present invention.

The gate-based decoupling cell 160, 160' shown in FIG. 8 has been obtained as a variation of the gate-based decoupling cell 160, 160' shown in FIG. 6, and differs therefrom in that additional first metal layers (M1) 228 are implemented in order to build up additional capacity/capacitance. On the one hand, first metal layers (M1) 228 are applied over, so as to almost completely cover, the polysilicon 220 layers, and on the other hand, further first metal layers (M1) 228 are applied in parallel to first metal layers (M1) 228 applied over the polysilicon 220 layers.

Still different constellation embodiments for the gate-based decoupling cell 160, 160', further to those shown in FIGS. 5 to 8, which may involve different numbers and types of transistors, size/width of the transistors, e.g. as defined by the size, shape and width of the polysilicon 220 layer overlying the diffusion layers 21, 230, as well as usage of additional metal layers (M1) 228 or other layers can be derived from the exemplary embodiments described above and are obvious for a skilled person, and are not explained in more detail herein.

FIG. 9 illustrates a top view of a gate-based decoupling cell 160, 160', with indications of structural dimensions, according to a fifth exemplary embodiment of the present invention.

The gate-based decoupling cell 160, 160' shown in FIG. 9 is similar to the gate-based decoupling cell 160, 160' shown in FIG. 6, and differs therefrom in that the minimum widths of the two stripe-shaped polysilicon 220 layers has been chosen to be the minimum width L220min that is allowed according to the constraints and requirements for the particular semiconductor manufacturing technology used for manufacturing the integrated circuit 100. In result, the minimum width L220min of the stripe-shaped polysilicon 220 layers is smaller than the dimension (width/diameter) L222 of the metal contact via 222.

Also indicated in FIG. 9 is an envisaged reconfiguration for a metal ECO, for which pin contacts and/or first layer metal to be removed are indicated (encircled) by an ellipse 236, and pin contacts and/or first layer metal to be added are indicated (encircled) by an ellipse 238. It is indicated in FIG. 9 that if a metal contact via 222 shall be added in the reconfiguration to be located on a stripe-shaped polysilicon 220 layer, the stripe-shaped polysilicon 220 layer on the right-hand side in FIG. 9, which has the minimum width L220min applicable for the manufacturing technology, is too narrow to accommodate a metal contact via 222 having the width L222, which may be determined by the constraints and the requirements for the manufacturing technology. By contrast, the stripe-shaped polysilicon 220 layer on the left-hand side in FIG. 9 is designed to have, in a central portion of the stripe as seen in the longitudinal direction of the stripe, an extended width L222ext as compared to the minimum width L222min that is present outside of the central portion, wherein the extended width L222ext is greater than the width L222 of the metal contact via 222, so that the metal contact via 222 can in fact be accommodated in the central portion of the stripe-shaped polysilicon 220 layer shown on the left-hand side in FIG. 9. The particular design of the stripe-shaped polysilicon 220 layer shown on the left-hand side in FIG. 9 is only one example of a constraint that comes forth from the constraints and the requirements for the manufacturing technology.

In the following, with references to FIG. 5 and to FIG. 9, at least some characteristic common features of gate-based transistors 160, 160' according to the invention as well as at least some of the constraints and requirements, which may result from the manufacturing technology and/or from the associated DRC rules, for the dimensions of the elements (viz. p-type diffusion layer 230, the n-type diffusion layer 214, the polysilicon 220 layer, the metal contact via 222, and the first layer metal (M1) 228) of gate-based transistors 160, 160' according to the invention will be described, and it will be shown how the gate-based transistors 160, 160' according to the invention distinguish from conventional decoupling cells.

Conventional decoupling cells are generally designed to be optimized in respect of their capacity, or their provideable capacitance. Also in conventional decoupling cells, as is the case for gate-based decoupling cells 160, 160', the capacity/capacitance is built up between the transistor gates formed by the polysilicon layer connected to one supply line, and the diffusion layer connected to the opposite supply line.

In order to optimize this capacity, the areal overlap of the polysilicon layer over the diffusion layer may be optimized. Such optimization would lead to the polysilicon layer being designed to cover as much as possible (according to the rules and constraints of manufacturing technology) of the diffusion layer. For example, instead of the stripe-shaped polysilicon layers occurring in the gate-based decoupling cells 160, 160' shown in FIGS. 5 to 9, the width of the polysilicon layer above the diffusion layers would be increased, so that one may speak of plate-shaped polysilicon layers and of a length of the polysilicon layer in a direction parallel to the longitudinal direction of the diffusion layer, which in turn is parallel to the extension direction of the supply lines 224, 226, where this length might almost uniformly and completely cover the diffusion layer along its length direction. Now, if in the course of a reconfiguration, such a plate-shaped polysilicon layer shall be contacted to become a switchable gate electrode of a transistor, the large extension of the polysilicon layer over the diffusion layer would cause very slow switching (or very long switching times) of such a transistor, which would therefore not be suitable. On the contrary, a gate-based decoupling cell 160, 160' is designed such that after a reconfiguration in a metal ECO, there are created suitable transistors with suitable switching times.

This is only one example reason, why conventional decoupling layers are generally not suitable for reconfiguration in a metal ECO, as are the gate-based decoupling cells 160, 160'.

Furthermore, the potential large extension of the polysilicon layer over the diffusion layer in a conventional decoupling cell would also result in that the number of transistors, that may be created out of the polysilicon layer, is very low, possible only one. On the contrary, for a gate-based decoupling cell 160, 160' it is desired that the number of transistors, that may be created out of the polysilicon layer in the course of a metal ECO, is very large, so that the large number of transistors offers a great flexibility for designing different types of functional cells in the course of a metal ECO. This is another example reason, why conventional decoupling layers are generally not suitable for reconfiguration in a metal ECO, as are the gate-based decoupling cells 160, 160'.

Contrary to conventional decoupling cells, the gate-based decoupling cells 160, 160' according to the invention are designed such that they are most suitable for a reconfiguration in a metal ECO. In order to be suitable for a reconfiguration in a metal ECO, the gate-based decoupling cells 160, 160' according to the invention have the following common features and satisfy the following constraints and the requirements for the dimensions of the elements thereof.

1. In order to be suitable for a reconfiguration in a metal ECO, and provide flexibility in respect of the types of functional cells that can be created thereout, the gate-based decoupling cells 160, 160' shall be designed such that as many transistors as possible can be created on the basis of the polysilicon 220 layer and the p-type and the n-type diffusion layers 230, 214. —In particular, the gate-based decoupling cells 160, 160' shall be designed such that there may be created at least two transistors along the length L214, L230, as seen in the longitudinal direction of the diffusion layers 214, 230 and/or in a direction parallel to the supply lines 224, 226. This imposes a constraint on the number of polysilicon 220 layers that shall be placed in parallel to each other and to extend over the diffusion layers 214, 230 in a transverse direction to the longitudinal direction of the diffusion layers 214, 230.
2. Further in order to be suitable for a reconfiguration in a metal ECO, and enable creating thereout many different types of functional cells, the gate-based decoupling cells 160, 160' shall be designed to have both types of transistors, i.e. p-type transistors and n-type transistors.
3. Further in order to be suitable for a reconfiguration in a metal ECO, the p-type and the n-type diffusion layers 230, 214 of a gate-based decoupling cell 160, 160' shall extend continuously, i.e. without an interruption or gap, over the whole length L214, L230 of the diffusion layers in the longitudinal direction of the diffusion layers 230, 214 and/or in a direction parallel to the extension direction of the supply lines 224, 226.

In order to formulate further constraints and requirements for gate-based decoupling cell 160, 160' according to the invention to be suitably reconfigurable in a metal ECO to a functional cell, the following dimensions (lengths, or widths), as seen in a top view of the gate-based decoupling cells 160, 160', must be considered, refer to FIGS. 5 and 9.

the length L110 of a cell in the longitudinal direction of the diffusion layers 230, 214 and/or in a direction parallel to the extension direction of the supply lines 224, 226, hereinafter called "the longitudinal direction", the length L214 of the n-type diffusion region in the longitudinal direction, the length L230 of the p-type diffusion region in the the longitudinal direction, the minimum length L220min (or width) of a polysilicon (or gate) 220 layer in the longitudinal direction, an extended minimum length L220ext (or width) of a polysilicon (or gate) 220 layer in the longitudinal direction, the maximum length L220max (or width) of a polysilicon (or gate) 220 layer in the longitudinal direction, the length L222 (or diameter) of metal contact via 222, the length L228 (or width) of first layer metal (M1) 228 in the longitudinal direction, remaining "free" lengths R214-1, R214-2, R214-3 of sections of the n-type diffusion region 214, wherein "free" means "not covered by the polysilicon 220 layer", and remaining "free" lengths R230-1, R230-2, R230-3 of sections of the p-type diffusion region 230, wherein "free" means "not covered by the polysilicon 220 layer".

Using the afore-mentioned dimensions, the following further constraints and requirements, which are characteristic for gate-based decoupling cells 160, 160' according to the invention, can be formulated.

4. The length L220 of the polysilicon 220 layer in the longitudinal direction, which corresponds to the length/width of the gate of a transistor, shall be close to, i.e. somewhat greater than or equal to, the minimum gate width which can be processed according to the manufacturing technology used for the integrated circuit 100, and shall attain at maximum (i.e. as L220max) about two-times the minimum processable gate width L220min. —This constraint ensures that many transistors can be placed along the longitudinal direction, while the gate width remains small enough so that reasonably short switching times of the transistors can be achieved.
5. The length L220 of the polysilicon 220 layer in the longitudinal direction shall be greater than the length L222 (or width or diameter) of a metal contact via 222 in the longitudinal direction according to the manufacturing technology used for the integrated circuit 100. For this condition to be satisfied, it may be necessary to design the length L220 of the polysilicon 220 layer in the longitudinal direction somewhat greater than the minimum processable gate width L220min, to attain an extended minimum gate width L220ext, at least in a section of the stripe-shaped polysilicon 220 layer. —This constraint ensures that a metal contact via 222 can be placed in/on a polysilicon 220 layer, as it is illustrated in FIG. 9.
6. When a plurality of polysilicon 220 layers are placed in parallel to each other and to extend over the p-type diffusion layer 230 in a transverse direction that is perpendicular to the longitudinal direction, then there shall be remaining free (i.e. uncovered by the polysilicon 220 layer) lengths R230-1, R230-2, R230-3 of sections of the p-type diffusion layer 230, as seen in the longitudinal direction, wherein each one of the remaining free lengths R230-1, R230-2, R230-3 is greater than the length L222 (or width or diameter) of a metal contact via 222 and/or greater than the length L228 (or width) of a first layer metal (M1) 228.

Likewise, when a plurality of polysilicon 220 layers are placed in parallel to each other and to extend over the n-type diffusion layer 214 in a transverse direction that is perpendicular to the longitudinal direction, then there shall be remaining free (i.e. uncovered by the polysilicon 220 layer) lengths R214-1, R214-2, R2140-3 of sections of the n-type diffusion layer 214, as seen in the longitudinal direction, wherein each one of the remaining free lengths R214-1, R214-2, R214-3 is greater than the length L222 (or width or diameter) of a metal contact via 222 and/or greater than the length L228 (or width) of a first layer metal (M1) 228.

These two constraints ensure that a metal contact via 222 and/or a first layer metal (M1) 228 can be placed between two stripe-shaped polysilicon 220 layers and/or on each side of each one of the stripe-shaped polysilicon 220 layers.

Figure 11:
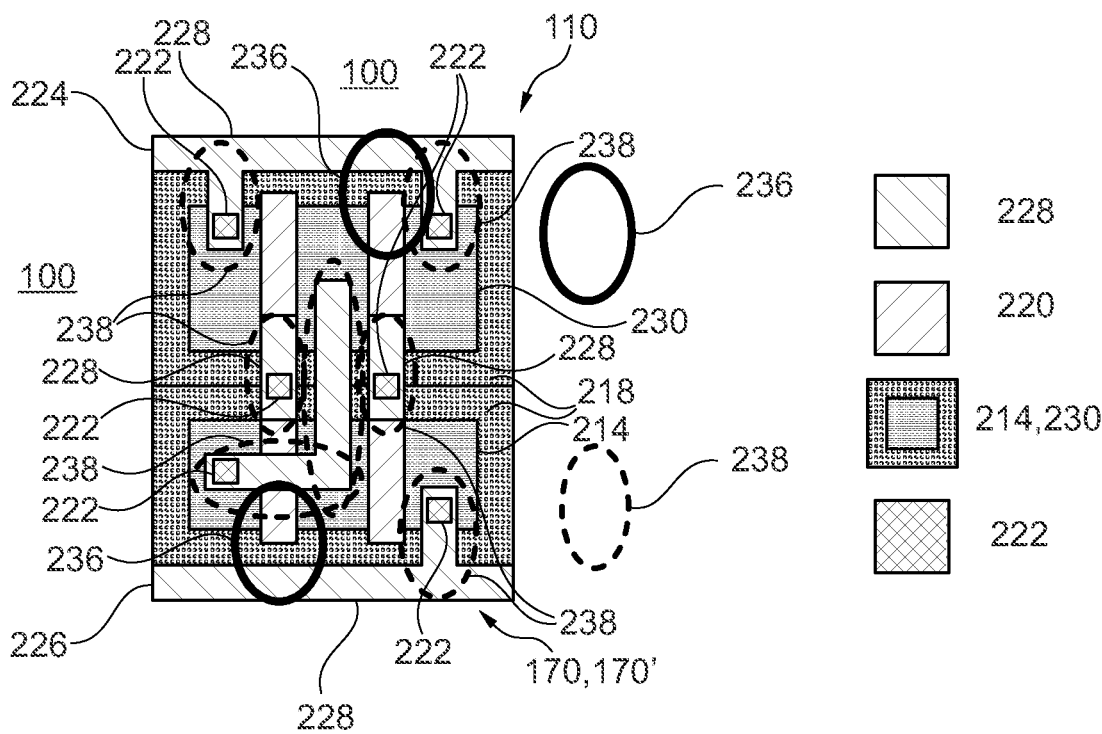
FIG. 11 illustrates a top view the reconfigured gate-based decoupling cell of FIGS. 6 and 10, after the reconfiguration illustrated in FIG. 10 has been implemented, according to an exemplary embodiment of the present invention.

For illustration of the afore-mentioned design constraints and requirements nos. 2 to 6, reference is now made to FIGS. 10 and 11.

FIG. 10 illustrates a top view of an example of how the gate-based decoupling cell 160, 160' of FIG. 6 can be reconfigured, according to an exemplary embodiment of the present invention. FIG. 11 illustrates a top view the reconfigured gate-based decoupling cell of FIGS. 6 and 10, after the reconfiguration illustrated in FIG. 10 has been implemented, according to an exemplary embodiment of the present invention.

FIG. 10 shows the gate-based decoupling cell 160, 160' of FIG. 6. It is assumed that a this gate-based decoupling cell 160, 160' is to be reconfigured in the course of a metal ECO. A suitable new cell function for the gate-based decoupling cell 160, 160' has been determined, namely the cell shall be reconfigured to become a NAND gate having two inputs, like the NAND gate shown in FIG. 4. According to the reconfiguration in the course of the metal ECO, some of the pin contacts (or metal contact vias) 222 and some portions of first layer metal 228 have to be removed, while new pin contacts (or metal contact vias) 222 and new portions of first layer metal 228 have to be added. The contacting elements to be removed are indicated in FIGS. 10 and 11 by showing them encircled with a continuous border line 236. By contrast, the contacting elements to be added are indicated in FIGS. 10 and 11 by showing them encircled with a dashed border line 238.

As shown in the upper left area and in the upper right area of FIG. 11, new portions of first layer metal 228, which connect to the supply line 224, and new metal contact vias 222, which contact the p-type diffusion region 230, are added. Further, also in the lower right area of FIG. 11, a new portion of first layer metal 228, which connects to the opposite supply line 226, and a new metal contact via 222, which contacts the n-type diffusion region 214, are added. The added upper two portions of first layer metal 228 and metal contact vias 222 are placed over the p-type diffusion region 230, and the added lower portion of first layer metal 228 and metal contact via 222 are placed over the n-type diffusion region 214, in each case beside a stripe-shaped polysilicon 220 layer.

The addition of the upper two portions of first layer metal 228 and the two new metal contact vias 222 are an illustration of the first one of the constraints mentioned above under item 6: namely that the remaining free lengths R230-1 and R230-3 (see FIG. 5) are greater than the length L222 of a metal contact via 222 and/or greater than the length L228 of a first layer metal 228, so that the new first layer metal 228 and the new metal contact vias 222 can be accommodated beside the stripe-shaped polysilicon 220 layer over the p-type diffusion region 230.

The addition of the lower portion of first layer metal 228 and the new metal contact via 222 is an illustration of the second one of the constraints mentioned above under item 6: namely that the remaining free length R214-3 (see FIG. 5) is greater than the length L222 of a metal contact via 222 and/or greater than the length L228 of a first layer metal 228, so that the new first layer metal 228 and the new metal contact vias 222 can be accommodated beside the stripe-shaped polysilicon 220 layer over the n-type diffusion region 214.

Further, as shown in the central area of FIG. 11, a new metal contact via 222, which contacts the p-type diffusion region 230 and a new portion of first layer metal 228, which connects via the new metal contact via 222 to the p-type diffusion region 230 and which extends over the n-type diffusion region 214, are added.

The addition of the central portion of first layer metal 228 and the new metal contact via 222 are an illustration of the first and the second one of the constraints mentioned above under item 6: namely that the remaining free length R230-2 and R214-3 (see FIG. 5) are greater than the length L222 of a metal contact via 222 and/or greater than the length L228 of a first layer metal 228, so that the new metal contact via 222 and the new first layer metal 228 can be accommodated between the two stripe-shaped polysilicon 220 layers over the p-type diffusion region 230 and over the n-type diffusion region 214.

The NAND gate having two inputs shown in FIG. 11 is an example of a reconfigured cell 170, 170', which has been obtained from a gate-based decoupling cell shown in FIG. 10 that requires transistors of both types, p-type and n-type, and accordingly both types of diffusion region, the p-type diffusion region 230 and the n-type diffusion region 214. The capability to be reconfigurable as a NAND gate having two inputs shown in FIG. 11 is an example for the constraint mentioned above under item 2.

It can further be seen in FIGS. 10 and 11 that the p-type and the n-type diffusion layers 230, 214 of the gate-based decoupling cell 160, 160' (and the reconfigured cell 170, 170') extend continuously, i.e. without an interruption or gap, over the whole lengths L214, L230 (see FIG. 5) of the diffusion layers in the longitudinal direction of the diffusion layers 230, 214 and/or in a direction parallel to the extension direction of the supply lines 224, 226, which is an example for the constraint mentioned above under item 3.

Still further, as shown at the left and at the right-hand side of the central area of FIG. 11, new metal contact vias 222, and new portions of first layer metal 228, which connect, respectively, to the one and the other polysilicon 220 layer, are added over the stripe-shaped polysilicon 220 layers. The addition of the new metal contact vias 222 over the stripe-shaped polysilicon 220 layers are illustrations of constraint mentioned above under item 5: namely, the length L220 (see FIG. 5) of the polysilicon 220 layer in the longitudinal direction must be greater than the length L222 (or diameter) of a metal contact via 222 in the longitudinal direction.

Finally, with reference now to FIG. 5, it is noted that in this embodiment of a gate-based decoupling cell 160, 160', each one of the two polysilicon 220 layers has a varying length L220 in the longitudinal direction. For example, the left one of the two polysilicon 220 layers has, over the p-type diffusion region 230, the minimum length L220min, which can be processed according to the manufacturing technology used for the integrated circuit 100, and has, over the n-type diffusion region 214, a greater length, which is almost two-times the length over the p-type diffusion region 230.

The two polysilicon 220 layers shown in FIG. 5 are designed to comply with the constraint mentioned above under item 4: Namely, the length L220 of the polysilicon 220 layer (left one in FIG. 5) in the longitudinal direction, which extends over the p-type diffusion layer, is close to, the minimum gate width which can be processed according to the manufacturing technology used for the integrated circuit 100, and attains a maximum (i.e. over the n-type diffusion layer 214, as L220max) about two-times the minimum processable gate width L220min.

Since the gate-based decoupling cell 160, 160' shown in FIG. 10 satisfies the constraints for the dimensions of the elements of gate-based transistors 160, 160' according to the invention mentioned above under items 2 to 6, the gate-based decoupling cell 160, 160' shown in FIG. 10 can be reconfigured, if needed, for a metal ECO, for example to become the reconfigured gate-based decoupling cell 170, 170' shown in FIG. 11.

Figure 12:
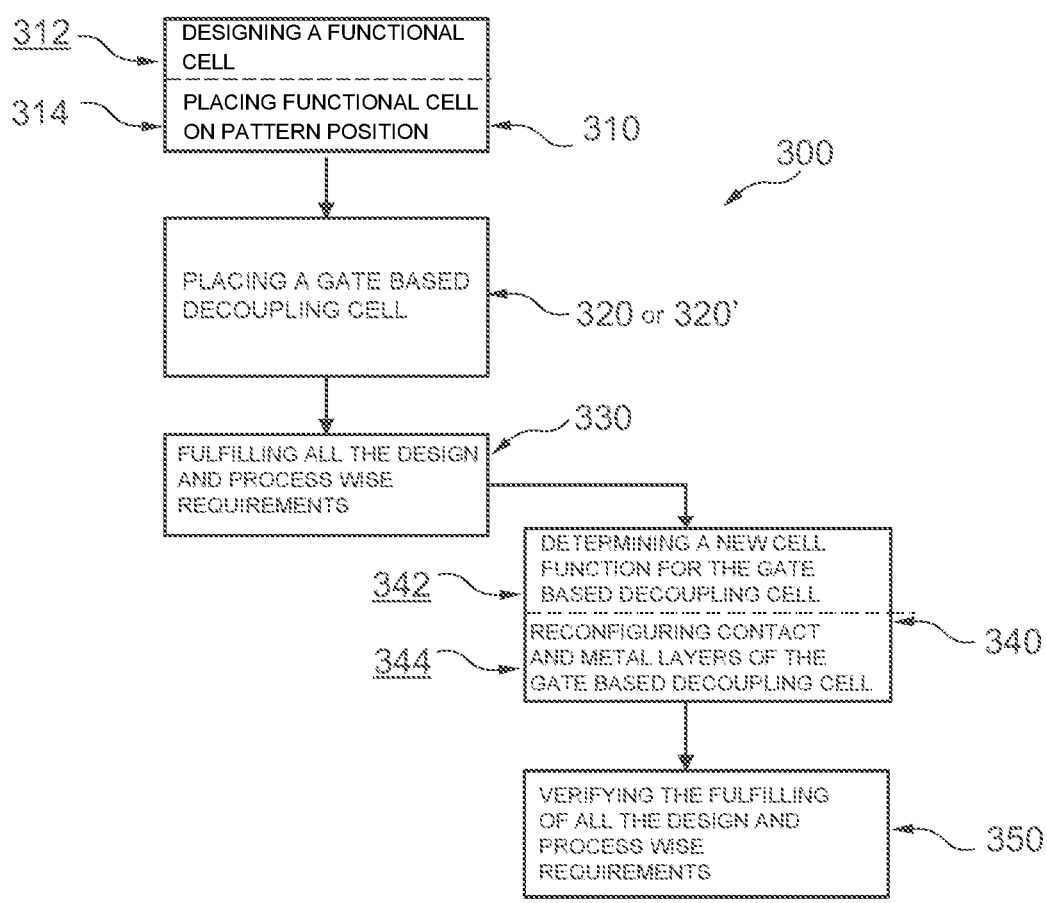
FIG. 12 illustrates flow diagram of a method for designing an integrated circuit, according to an exemplary embodiment of the present invention.

FIG. 12 illustrates flow diagram of a method 300 for designing an integrated circuit 100, according to an exemplary embodiment of the present invention.

The method 300 is for designing an integrated circuit 100, wherein the integrated circuit is to be structured in cells 110, wherein the cells 110 are to comprise functional cells 120 and spare cells 130. The method 300 starts with a step 310 of placing and routing functional cells on pattern positions, which comprises intrinsically the step 312 of designing at least one functional cell, and the step 314 of placing a plurality of functional cells 120 on associated pattern positions of a pattern matrix designed for the functional cells of the integrated circuit.

Then, the method proceeds to step 320, wherein a gate-based decoupling cells is placed on at least one of the remaining pattern positions of the pattern matrix and instead of at least one spare cell 130 conceivable for the at least one of the remaining pattern positions of the pattern matrix. The step 320 may also comprise placing, on a plurality of remaining pattern positions of the pattern matrix and instead of a plurality of spare cells 130 conceivable for the plurality of remaining pattern positions of the pattern matrix, an according plurality of gate-based decoupling cells 160.

Alternatively to proceeding to step 320, the method proceeds to step 320', wherein a gate-based decoupling cells is placed in at least one gap between pattern positions of the matrix pattern and instead of at least one filler cell 140 conceivable for the at least one gap between pattern positions of the pattern matrix. The step 320' may also comprise placing, in a plurality of gaps between pattern positions of the pattern matrix and instead of a plurality of filler cells 140 conceivable for the plurality of gaps between pattern positions of the pattern matrix, an according plurality of gate-based decoupling cells 160'.

The at least one gate-based decoupling cell 160, 160' placed in step 320 or step 320' comprises at least one diffusion layer 214 for forming a source region 208 and/or a drain region 210 of a transistor 200, and a polysilicon layer 220 arranged partially over the at least one diffusion layer 214. The polysilicon layer 220 is electrically conductively connected to a supply line 224 of the gate-based decoupling cell 160, 160', and the at least one diffusion layer 214 is electrically conductively connected to an opposite supply line 226 of the gate-based decoupling cell 160, 160'. In result, a capacitance is created between the polysilicon layer 220 connected to the supply line 224 and the diffusion layer 214 connected to the opposite supply line 226.

The method then proceeds to step 330, wherein the fulfilling of all design- and process-wise requirements of the designed integrated circuit, including that of the functional cells 120 and the at least one gate-based decoupling cell 160, 160', is verified.

The method may then proceed to step 340, which comprises reconfiguring at least one of the gate-based decoupling cells 160, 160' in the course of a metal ECO (engineering change order). The step 340 may comprise the step 342 of determining a suitable new cell function for the at least one gate-based decoupling cell 160, 160', and the step 344 of reconfiguring contact layers 234 and metal layers 228, 232 of the at least one gate-based decoupling cell 160, 160'. The steps 342 and 344 may be performed so as to implement the determined new cell function of the reconfigured at least one gate-based decoupling cell 170, 170'.

The step 340 of reconfiguring of the at least one gate-based decoupling cell 160, 160' may comprise removing the contact and/or metal layers 232, 234, which created the decoupling function of the at least one gate-based decoupling cell 160, 160', and adding new contact and/or metal layers 232', 234', which create a desired suitable new cell function of the reconfigured at least one gate-based decoupling cell 170, 170'.

The reconfiguring as per step 340 of the at least one gate-based decoupling cell 160, 160' may be performed manually by an integrated circuit design engineer. Alternatively, the reconfiguring as per step 160 of the at least one gate-based decoupling cell 160, 160' may comprise selecting a design for a suitable new cell function of the reconfigured at least one gate-based decoupling cell 170, 170' from a library.

Finally, the method may proceed to step 350, which comprises verifying the fulfilling of all design- and process-wise requirements of the integrated circuit that has been reconfigured in the course of the metal engineering change order, including that of the functional cells 120 and the at least one reconfigured gate-based decoupling cell 170, 170'.

In this specification, example embodiments have been presented in terms of a selected set of details. However, a person of ordinary skill in the art would understand that many other example embodiments may be practiced which include a different selected set of these details. It is intended that the following claims cover all possible example embodiments.

Supplementary, it is to be noted that "having" or "comprising" does not exclude other elements or steps, and that "a" or "an" does not exclude a plurality. In addition, it is to be noted that features or steps, which have been described above with reference to one of the above embodiment examples, may also be used in combination with other features or steps of other embodiment examples that have been described above. Reference numerals in the claims are not to be construed as limitations.

LIST OF REFERENCE NUMERALS 100 integrated circuit
110 cell
120 functional cell
130 spare cell
140 filler cell
150 reconfigured filler cell
160, 160' gate-based decoupling cell
170, 170' reconfigured gate-based decoupling cell 200 transistor
202 wafer
204 p-well
206 shallow trench isolation (STI)
208 source region
210 drain region
212 bridge region
214 n-type diffusion region
216 channel region
218 oxide layer
220 polysilicon (or gate)
222 metal contact via
224 supply line
226 opposite supply line
228 first layer metal (M1)
230 p-type diffusion region
232 cell-internal layer metal (M1)
234 cell-internal pin contact
236 pin contact and/or first layer metal to be removed
238 pin contact and/or first layer metal to be added
L110 length of cell
L214 length of n-type diffusion region
L230 length of p-type diffusion region
L220min minimum length (or width) of polysilicon (or gate)
L220ext extended minimum length (or width) of polysilicon (or gate)
L220max maximum length (or width) of polysilicon (or gate)
L222 length (or diameter) of metal contact via
L228 length of first layer metal (M1)
R214-1, R214-2, R214-3 remaining free length of n-type diffusion region
R230-1, R230-2, R230-3 remaining free length of p-type diffusion region
300 method for designing an integrated circuit
310 placing and routing functional cells on pattern positions
312 designing at least one functional cell
314 placing a plurality of functional cells on associated pattern positions of a pattern matrix designed for the functional cells
320 placing a gate-based decoupling cells on a remaining pattern position of the pattern matrix
320' placing a gate-based decoupling cells in a gap between pattern positions of the pattern matrix
330 verifying the fulfilling of all design- and process-wise requirements of functional cells and the at least one gate-based decoupling cell
340 reconfiguring at least one of the gate-based decoupling cells
342 determining a suitable new cell function for the at least one gate-based decoupling cell
344 reconfiguring contact layers and metal layers of the at least one gate-based decoupling cell
350 verifying the fulfilling of all design- and process-wise requirements of the functional cells and the at least one reconfigured gate-based decoupling cell

The invention claimed is:

1. A method for changing an integrated circuit design, the method comprising:
providing at least one functional cell for the integrated circuit design;
replacing a spare cell for the integrated circuit design with a gate-based decoupling cell, wherein the gate-based decoupling cell includes an n-type diffusion region, a p-type diffusion region, and a plurality of polysilicon lines, each polysilicon line of the plurality of polysilicon lines extending over both the n-type diffusion region and the p-type diffusion region, the n-type and p-type diffusion regions both connected to a first power supply line and the plurality of polysilicon lines connected to a second power supply line, wherein the first power supply line is for receiving a power supply voltage that is different from a power supply voltage received by the second power supply line; and
reconfiguring the the gate-based decoupling cell for the integrated circuit design to a logic function in response to an engineering change order (ECO), wherein the gate-based decoupling cell is reconfigured by removing the second power supply line connections to the polysilicon lines and the first power supply line connections to the n-type and p-type diffusion layers, and adding new connections to implement the logic function.

2. The method according to claim 1, wherein the first and second power supply lines are formed in one or more metal layers and reconfiguring the gate-based decoupling cell further comprises removing the one or more metal layers and adding one or more new metal layers.

3. The method according to claim 1, wherein a first power supply voltage received by the first power supply line is at ground potential, and a second power supply voltage received by the second power supply line is a positive power supply voltage.

4. The method according to claim 1, further comprising verifying all design-wise and process-wise requirements of the changed integrated circuit design, including that of the at least one functional cells and the cell.

5. The method according to claim 1,
wherein the reconfiguring of the gate-based decoupling cell is performed manually by an integrated circuit design engineer, or
wherein the reconfiguring of the gate-based decoupling cell comprises selecting a design for the logic function from a library.

6. A method for changing an integrated circuit design, the method comprising:
providing a plurality of functional cells for the integrated circuit design;
replacing a plurality of spare cells for the integrated circuit design with a plurality of gate-based decoupling cells, wherein each of the gate-based decoupling cells includes an n-type diffusion region, a p-type diffusion region, and a plurality of poly silicon lines, each poly silicon line of the plurality of poly silicon lines extending over both the n-type diffusion region and the p-type diffusion region, the n-type and p-type diffusion regions both connected to a first power supply line and the plurality of polysilicon lines connected to a second power supply line, wherein the first power supply line is for receiving a power supply voltage that is different from a power supply voltage received by the second power supply line; and
reconfiguring the gate-based decoupling cells for the integrated circuit design to a logic function in response to an engineering change order (ECO), wherein each of the gate-based decoupling cells is reconfigured by removing the second power supply line connections to the polysilicon lines and the first power supply line connections to the n-type and p-type diffusion layers, and adding new connections to implement the logic function.

7. The method according to claim 6, wherein the first and second power supply lines are formed in one or more metal layers and reconfiguring the gate-based decoupling cells further comprises removing the one or more metal layers and adding one or more new metal layers.

8. The method according to claim 6, wherein a first power supply voltage received by the first power supply line is at ground potential, and a second power supply voltage received by the second power supply line is a positive power supply voltage.

* * * * *